DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 16, 1970

875 O.G. 361

T875,016
PHOTOTHERMOGRAPHIC SYSTEM
Frederick A. Stahly, Kodak Park,
Rochester, N.Y. 14650
Filed Oct. 27, 1969, Ser. No. 869,886
Int. Cl. G03c *5/18, 5/34, 11/12*
U.S. Cl. 96—49
No Drawing. 12 Pages Specification

A photothermographic system for the production of images is provided by a supported photosensitive layer comprising a light-sensitive organic salt, in particular, a diazonium salt of an inorganic acid, such as p-diazo-N-diethylaniline zinc chloride, and a polymeric binder, such as a polyvinyl acetate or a cyclohexane dimethanoladipate-azelate copolyester, wherein the salt is capable of plasticizing or reducing the tackifying temperature of the exposed portions of the layer upon imagewise exposure to light. The exposed, plasticized image then may be toned or differentially transferred to a receiving surface. Optical density can be given to the transferred image by incorporating a colorant or color-forming component in the photosensitive layer.